United States Patent
Obata

(10) Patent No.: US 7,899,102 B2
(45) Date of Patent: Mar. 1, 2011

(54) SEMICONDUCTOR LASER, METHOD FOR MANUFACTURING SEMICONDUCTOR LASER, OPTICAL DISK DEVICE, AND OPTICAL PICKUP

(75) Inventor: Toshiaki Obata, Miyagi (JP)

(73) Assignee: Sony Corporation, Tokyo (JP)

( * ) Notice: Subject to any disclaimer, the term of this patent is extended or adjusted under 35 U.S.C. 154(b) by 78 days.

(21) Appl. No.: 12/487,195

(22) Filed: Jun. 18, 2009

(65) Prior Publication Data

US 2009/0316744 A1 Dec. 24, 2009

(30) Foreign Application Priority Data

Jun. 20, 2008 (JP) ................. 2008-161523

(51) Int. Cl.
*H01S 5/00* (2006.01)

(52) U.S. Cl. .................... 372/44.01; 372/45.01

(58) Field of Classification Search ............ 372/50.11, 372/44.011, 45.01; 257/103; 438/39
See application file for complete search history.

(56) References Cited

U.S. PATENT DOCUMENTS

| | | | | |
|---|---|---|---|---|
| 4,948,753 | A * | 8/1990 | Yoshikawa et al. | 438/40 |
| 5,932,114 | A * | 8/1999 | Makiuchi | 216/24 |
| 6,865,203 | B2 | 3/2005 | Yoshida et al. | |
| 6,984,542 | B2 * | 1/2006 | Yanagisawa et al. | 438/51 |
| 7,011,994 | B2 * | 3/2006 | Yanagisawa et al. | 438/149 |
| 7,120,181 | B1 | 10/2006 | Hayashi et al. | |

FOREIGN PATENT DOCUMENTS

| | | |
|---|---|---|
| JP | HEI 07-263798 A | 10/1995 |
| JP | 2000-183457 A | 6/2000 |
| JP | 2000-277859 | 10/2000 |
| JP | 2001-274514 | 10/2001 |
| JP | 2002-185040 A | 6/2002 |
| JP | 2003-10156 | 4/2003 |
| JP | 2003-101156 A | 4/2003 |
| JP | 2003-179311 | 6/2003 |

OTHER PUBLICATIONS

S. Kicin et al.; Micro-Raman study of InGaP composition grown on V-grooved substrates; Materials Science and Engineering B, vol. 113, p. 111-116 (2004). H.P. Meier et al.: Molecular beam epitaxy of GaAs/AlGaAs quantum wells on channeled substrates; Appl. Phys. Lett, 54; p. 433; Jan. 30, 1989.
Anurag Tyagi; Semipolar (1011) InGaN/GaN/GaN Laser Diodes on Bulk GaN Substrates; Japanese Journal of Applied Physics; vol. 46, No. 19; 1007; pp. L444-L445.
Japanese Patent Office, Office Action issued in Patent Application JP 2008-161523, on Mar. 16, 2010.

* cited by examiner

*Primary Examiner* — Minsun Harvey
*Assistant Examiner* — Tuan N. Nguye
(74) *Attorney, Agent, or Firm* — SNR Denton US LLP

(57) ABSTRACT

A semiconductor laser including: a nitride III-V compound semiconductor substrate configured to have a first planar area, a second planar area, and a third planar area in a major surface, the first planar area being formed of a C-plane, the second planar area being continuous with the first planar area and being formed of a semipolar plane inclined to the first planar area, the third planar area being continuous with the second planar area and being formed of a C-plane parallel to the first planar area; a first cladding layer configured to be composed of a nitride III-V compound semiconductor on the major surface of the nitride III-V compound semiconductor substrate; an active layer configured to be composed of a nitride III-V compound semiconductor that exists on the first cladding layer and contains In; and a second cladding layer configured to be composed of a nitride III-V compound semiconductor on the active layer.

10 Claims, 10 Drawing Sheets

POLAR PLANE
(PERPENDICULAR TO C-AXIS)

NONPOLAR PLANE
(PARALLEL TO C-AXIS)

NONPOLAR PLANE
(PARALLEL TO C-AXIS)

(1) POLAR PLANE
(PERPENDICULAR TO C-AXIS)

(2) SEMIPOLAR PLANE
(INTERSECTING WITH C-AXIS) {1-10n}

(3) SEMIPOLAR PLANE
(INTERSECTING WITH C-AXIS) {11-2n}

SEMICONDUCTOR LASER, METHOD FOR MANUFACTURING SEMICONDUCTOR LASER, OPTICAL DISK DEVICE, AND OPTICAL PICKUP

BACKGROUND OF THE INVENTION

1. Field of the Invention

The present invention relates to a semiconductor laser, a method for manufacturing a semiconductor laser, an optical pickup, and an optical disk device, and particularly is suitable for being applied to a semiconductor laser based on a nitride III-V compound semiconductor, and an optical disk device and an optical pickup that include this semiconductor laser as the light source.

2. Description of the Related Art

To achieve self-pulsation (self-oscillation) operation in a semiconductor laser, a saturable absorber region needs to be provided inside the semiconductor laser. Ways for providing the saturable absorber region include a method in which the saturable absorber regions are formed in the partial portions of an active layer that are on both the sides of a ridge stripe and into which current is not injected at the time of the operation. In this method, the effective refractive index difference $\Delta n$ between the partial portion in the active layer plane corresponding to the center part of the ridge stripe and the partial portions in the active layer plane on both the sides of the ridge stripe is set small to thereby form the saturable absorber regions (weakly index guide structure). To set the difference $\Delta n$ small, the ridge stripe is so formed as to have small height (depth) so that the distance between the bottoms of the parts on both the sides of the ridge stripe and the upper surface of the active layer may be large. Semiconductor lasers that are based on a nitride III-V compound semiconductor and achieve self-pulsation operation by such a method have been proposed (refer to e.g. Japanese Patent Laid-open No. 2000-277859 and Japanese Patent Laid-open No. 2001-274514).

SUMMARY OF THE INVENTION

However, these self-pulsation semiconductor lasers of the related arts involve the following problems. Specifically, if sufficient saturable absorber regions are formed, light greatly leaks out in the lateral direction (in the direction perpendicular to the ridge stripe in the active layer plane), and thus the near-field pattern (NFP) is greatly distorted in the lateral direction. Furthermore, because light greatly leaks out in the lateral direction, the reactive current in the lateral direction tends to be large. As a result, the threshold current of the semiconductor laser is increased and simultaneously the relative intensity noise (RIN) is also deteriorated. In addition, at the time of the high-temperature operation of the semiconductor laser, the saturable absorber region is turned transparent or reduced due to increase in diffusion current, which causes weakening or stopping of the self-pulsation operation.

There is a need for the preferred embodiments of present invention to provide a semiconductor laser based on a nitride III-V compound semiconductor and a method for manufacturing the same, each allowing prevention of weakening or stopping of self-pulsation operation attributed to turning of a saturable absorber region into the transparent state or reduction in the saturable absorber region due to diffusion current at the time of high-temperature operation and suppression of instability of the near-field pattern to thereby easily allow achievement of both the required self-pulsation operation characteristic and static characteristic.

Moreover, there is another need for the preferred embodiments of the present invention to provide an optical disk device and an optical pickup that include this excellent semiconductor laser as the light source.

These needs will become apparent from description in the present embodiments with reference to accompanying drawings.

According to a first embodiment of the present invention, there is provided a semiconductor laser including:

a nitride III-V compound semiconductor substrate configured to have a first planar area, a second planar area, and a third planar area in a major surface, the first planar area being formed of a C-plane, the second planar area being continuous with the first planar area and being formed of a semipolar plane inclined to the first planar area, the third planar area being continuous with the second planar area and being formed of a C-plane parallel to the first planar area;

a first cladding layer configured to be composed of a nitride III-V compound semiconductor on the major surface of the nitride III-V compound semiconductor substrate;

an active layer configured to be composed of a nitride III-V compound semiconductor that exists on the first cladding layer and contains at least In; and a second cladding layer configured to be composed of a nitride III-V compound semiconductor on the active layer, wherein a ridge stripe is provided in a partial portion of the second cladding layer above the second planar area, and In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe.

According to a second embodiment of the present invention, there is provided a method for manufacturing a semiconductor laser. The method includes the steps of:

sequentially growing a first cladding layer composed of a nitride III-V compound semiconductor, an active layer composed of a nitride III-V compound semiconductor containing at least In, and a second cladding layer composed of a nitride III-V compound semiconductor over a major surface of a nitride III-V compound semiconductor substrate having a first planar area, a second planar area, and a third planar area in the major surface, the first planar area being formed of a C-plane, the second planar area being continuous with the first planar area and being formed of a semipolar plane inclined to the first planar area, the third planar area being continuous with the second planar area and being formed of a C-plane parallel to the first planar area; and forming a ridge stripe in a partial portion of the second cladding layer above the second planar area.

In this method for manufacturing a semiconductor laser, the growth rate of the active layer composed of the nitride III-V compound semiconductor containing at least In is higher above the first planar area and the third planar area, which are each formed of the C-plane, than above the second planar area formed of the semipolar plane inclined to the first planar area and the third planar area. Furthermore, the In composition of the active layer is higher above the first planar area and the third planar area than above the second planar area. As a result, the In composition of the partial portions of the active layer on both the sides of the ridge stripe is higher than that of the partial portion of the active layer corresponding to the ridge stripe, or the thickness of the partial portions of the active layer on both the sides of the ridge stripe is larger than that of the partial portion of the active layer corresponding to the ridge stripe. The In composition and thickness of the active layer gradually change along the direction from the first planar area and the third planar area toward the second planar area.

According to a third embodiment of the present invention, there is provided an optical disk device including a semiconductor laser as a light source. The semiconductor laser including:

a nitride III-V compound semiconductor substrate configured to have a first planar area, a second planar area, and a third planar area in a major surface, the first planar area being formed of a C-plane, the second planar area being continuous with the first planar area and being formed of a semipolar plane inclined to the first planar area, the third planar area being continuous with the second planar area and being formed of a C-plane parallel to the first planar area;

a first cladding layer configured to be composed of a nitride III-V compound semiconductor on the major surface of the nitride III-V compound semiconductor substrate;

an active layer configured to be composed of a nitride III-V compound semiconductor that exists on the first cladding layer and contains at least In; and a second cladding layer configured to be composed of a nitride III-V compound semiconductor on the active layer, wherein a ridge stripe is provided in a partial portion of the second cladding layer above the second planar area, and In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe.

According to a fourth embodiment of the present invention, there is provided an optical pickup including a semiconductor laser as a light source. The semiconductor laser including:

a nitride III-V compound semiconductor substrate configured to have a first planar area, a second planar area, and a third planar area in a major surface, the first planar area being formed of a C-plane, the second planar area being continuous with the first planar area and being formed of a semipolar plane inclined to the first planar area, the third planar area being continuous with the second planar area and being formed of a C-plane parallel to the first planar area;

a first cladding layer configured to be composed of a nitride III-V compound semiconductor on the major surface of the nitride III-V compound semiconductor substrate;

an active layer configured to be composed of a nitride III-V compound semiconductor that exists on the first cladding layer and contains at least In; and a second cladding layer configured to be composed of a nitride III-V compound semiconductor on the active layer, wherein a ridge stripe is provided in a partial portion of the second cladding layer above the second planar area, and In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe.

In the first to fourth embodiments of the present invention, typically, the In composition of the active layer increases in the direction from the center part of the ridge stripe toward both the sides of the ridge stripe and/or the thickness of the active layer increases in the direction from the center part of the ridge stripe toward both the sides of the ridge stripe. The semipolar plane of the second planar area is specifically a $\{11\text{-}2n\}$ plane (n is an integer equal to or larger than one, i.e. n=1, 2, 3, ... ) or a $\{1\text{-}10n\}$ plane (n is an integer equal to or larger than one, i.e. n=1, 2, 3, ... ). The extension direction of the ridge stripe is <1-100> if the semipolar plane is a $\{11\text{-}2n\}$ plane and the extension direction of the ridge stripe is <11-20> if the semipolar plane is a $\{1\text{-}10n\}$ plane.

FIGS. 9 and 10 show the relationship among a polar plane, nonpolar planes, and semipolar planes of a nitride III-V compound semiconductor. The polar plane is perpendicular to the C-axis. The nonpolar planes are parallel to the C-axis. The semipolar planes intersect with the C-axis. The polar plane is the C-plane. The nonpolar planes are the A-plane and the M-plane. The semipolar planes are a $\{11\text{-}2n\}$ plane or a $\{1\text{-}10n\}$ plane.

One of the first cladding layer and the second cladding layer is an n-cladding layer, and the other is a p-cladding layer. The active layer is typically composed of a nitride III-V compound semiconductor containing at least In and Ga.

The nitride III-V compound semiconductor is most generally $Al_xB_yGa_{1-x-y-z}In_zAs_uN_{1-u-v}P_v$ ($0 \leq x \leq 1$, $0 \leq y \leq 1$, $0 \leq z \leq 1$, $0 \leq u \leq 1$, $0 \leq v \leq 1$, $0 \leq x+y+z<1$, $0 \leq u+v<1$), more specifically $Al_xB_yGa_{1-x-y-z}In_zN$ ($0 \leq x \leq 1$, $0 \leq y \leq 1$, $0 \leq z \leq 1$, $0 \leq x+y+z<1$), and typically $Al_xGa_{1-x-z}In_zN$ ($0 \leq x \leq 1$, $0 \leq z \leq 1$). Specific examples of the nitride III-V compound semiconductor include, but not limited to, GaN, InN, AlN, AlGaN, InGaN, and AlGaInN. The nitride III-V compound semiconductor containing at least In, typically the nitride III-V compound semiconductor containing at least In and Ga, is $Al_xB_yGa_{1-x-y-z}In_zAs_uN_{1-u-v}P_v$ ($0 \leq x \leq 1$, $0 \leq y \leq 1$, $0<z \leq 1$, $0 \leq u \leq 1$, $0 \leq v \leq 1$, $0 \leq x+y+z<1$, $0 \leq u+v<1$), more specifically $Al_xB_yGa_{1-x-y-z}In_zN$ ($0 \leq x \leq 1$, $0 \leq y \leq 1$, $0<z \leq 1$, $0 \leq x+y+z<1$), and typically $Al_xGa_{1-x-z}In_zN$ ($0 \leq x \leq 1$, $0<z \leq 1$). Specific examples of the nitride III-V compound semiconductor containing at least In and Ga include, but not limited to, InGaN and AlGaInN.

The nitride III-V compound semiconductor can be grown typically by any of various kinds of epitaxial growth methods such as metal organic chemical vapor deposition (MOCVD), hydride vapor phase epitaxy, halide vapor phase epitaxy (HVPE), and molecular beam epitaxy (MBE). However, the growth method is not limited thereto.

The oscillation wavelength (emission wavelength) of the semiconductor laser depends mainly on the composition of the partial portion of the active layer corresponding to the center part of the ridge stripe, particularly on the In composition. The oscillation wavelength (emission wavelength) of the semiconductor laser is not particularly limited but may be e.g. the wavelength corresponding to any of blue, green, and red.

The nitride III-V compound semiconductor substrate having, in its main surface, the first planar area formed of the C-plane, the second planar area that is continuous with the first planar area and is formed of a semipolar plane inclined to the first planar area, and the third planar area that is continuous with the second planar area and is formed of the C-plane parallel to the first planar area can be manufactured e.g. by carrying out selective growth on the major surface of a nitride III-V compound semiconductor substrate having the flat major surface formed of the C-plane or carrying out selective etching for this major surface.

The optical disk device according to the third embodiment of the present invention encompasses all of reproduce-only (read-only) devices, record-only (write-only) devices, and devices that allow both reproducing and recording. The system of the reproducing and/or the recording is also not particularly limited. This optical disk device has one or both of a reproducing optical system and a recording optical system. The optical pickup according to the fourth embodiment of the present invention is suitable for being used for such an optical disk device.

According to a fifth embodiment of the present invention, there is provided a semiconductor laser including:

a first cladding layer configured to be composed of a nitride III-V compound semiconductor;

an active layer configured to be composed of a nitride III-V compound semiconductor that exists on the first cladding layer and contains at least In; and a second cladding layer configured to be composed of a nitride III-V compound semiconductor on the active layer, wherein an upper surface of the first cladding layer has a first planar area formed of a C-plane, a second planar area that is continuous with the first planar area and is formed of a semipolar plane inclined to the first planar area, and a third planar area that is continuous with the second planar area and is formed of a C-plane parallel to the first planar area, a ridge stripe is provided in a partial portion of the second cladding layer above the second planar area, and In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe.

According to a sixth embodiment of the present invention, there is provided a semiconductor laser including:

a first cladding layer configured to be composed of a nitride III-V compound semiconductor;

an active layer configured to be composed of a nitride III-V compound semiconductor that exists on the first cladding layer and contains at least In; and a second cladding layer configured to be composed of a nitride III-V compound semiconductor that exists on the active layer and contains at least In, wherein In composition of partial portions of the active layer on both sides of a laser stripe is higher than In composition of a partial portion of the active layer corresponding to the laser stripe and/or thickness of the partial portions of the active layer on both the sides of the laser stripe is larger than thickness of the partial portion of the active layer corresponding to the laser stripe.

In these semiconductor lasers, the first cladding layer is typically provided on a nitride III-V compound semiconductor substrate. However, this nitride III-V compound semiconductor substrate may be absent depending on the case. Furthermore, the major surface of the nitride III-V compound semiconductor substrate or the upper surface of the first cladding layer may have or does not have to have the first planar area formed of the C-plane, the second planar area that is continuous with the first planar area and is formed of a semipolar plane inclined to the first planar area, and the third planar area that is continuous with the second planar area and is formed of the C-plane parallel to the first planar area. The laser stripe may be one having a current confinement structure with a buried layer instead of a ridge stripe.

Except for this, the features described above about the first to fourth embodiments of the present invention apply to the fifth and sixth embodiments of the present invention, as long as the features do not contradict the characteristics of the fifth and sixth embodiments of the present invention.

In the first to fifth embodiments of the present invention having the above-described configurations, saturable absorber regions are formed in partial portions of the active layer in the vicinity of the parts directly beneath both the side surfaces of the ridge stripe. If the In composition of the partial portions of the active layer on both the sides of the ridge stripe is higher than that of the partial portion of the active layer corresponding to the ridge stripe, the band gap of the partial portions of the saturable absorber regions on both the sides of the ridge stripe is smaller than that of the partial portion of the active layer corresponding to the center part of the ridge stripe. Thus, the partial portions of the saturable absorber regions on both the sides of the ridge stripe easily absorb light from the partial portion of the active layer corresponding to the center part of the ridge stripe. Furthermore, if the thickness of the partial portions of the active layer on both the sides of the ridge stripe is larger than that of the partial portion of the active layer corresponding to the ridge stripe, the volume of the partial portions of the saturable absorber regions on both the sides of the ridge stripe is larger than that of the partial portions of the saturable absorber regions inside the ridge stripe.

As a result, there is no need to form the saturable absorber regions through setting of the effective refractive index difference $\Delta n$ in the lateral direction, differently from the case in which the In composition and thickness of the partial portion of the active layer inside the ridge stripe are the same as those of the partial portions of the active layer on both the sides of the ridge stripe. Therefore, the height of the ridge stripe can be set sufficiently large, which can eliminate the problem that the saturable absorber region is turned transparent or reduced due to diffusion current at the time of high-temperature operation. Moreover, because the height of the ridge stripe can be set sufficiently large, the effective refractive index difference $\Delta n$ can be set sufficiently large. This can prevent light from greatly leaking out in the lateral direction and thus can suppress instability of the near-field pattern.

In the sixth embodiment of the present invention having the above-described configuration, saturable absorber regions are formed in partial portions of the active layer in the vicinity of both the side surfaces of the laser stripe. If the In composition of the partial portions of the active layer on both the sides of the laser stripe is higher than that of the partial portion of the active layer corresponding to the laser stripe, the band gap of the partial portions of the saturable absorber regions on both the sides of the laser stripe is smaller than that of the partial portion of the active layer corresponding to the center part of the laser stripe. Thus, the partial portions of the saturable absorber regions on both the sides of the laser stripe easily absorb light from the partial portion of the active layer corresponding to the center part of the laser stripe. Furthermore, if the thickness of the partial portions of the active layer on both the sides of the laser stripe is larger than that of the partial portion of the active layer corresponding to the laser stripe, the volume of the partial portions of the saturable absorber regions on both the sides of the laser stripe is larger than that of the partial portions of the saturable absorber regions inside the laser stripe.

As a result, there is no need to form the saturable absorber regions through setting of the effective refractive index difference $\Delta n$ in the lateral direction, differently from the case in which the In composition and thickness of the partial portion of the active layer inside the laser stripe are the same as those of the partial portions of the active layer on both the sides of the laser stripe. Therefore, the height of the laser stripe can be set sufficiently large, which can eliminate the problem that the saturable absorber region is turned transparent or reduced due to diffusion current at the time of high-temperature operation. Moreover, because the height of the laser stripe can be set sufficiently large and the partial portions of the saturable absorber regions on both the sides of the laser stripe easily absorb light from the partial portion of the active layer corresponding to the center part of the laser stripe, the effective refractive index difference Δn can be set sufficiently large. This can prevent light from greatly leaking out in the lateral direction and thus can suppress instability of the near-field pattern.

These embodiments of the present invention allow achievement of a semiconductor laser that can prevent weakening or stopping of self-pulsation operation attributed to turning of a saturable absorber region into the transparent state or reduction in the saturable absorber region due to diffusion current at the time of high-temperature operation and suppress instability of the near-field pattern, and thus can easily achieve both the required self-pulsation operation characteristic and static characteristic. Furthermore, by using this excellent semiconductor laser as the light source of an optical pickup, a high-performance optical disk device can be achieved.

DETAILED DESCRIPTION OF THE PREFERRED EMBODIMENTS

Embodiments of the present invention will be described below with reference to the drawings. In all the drawings for the embodiments, the same or corresponding parts are given the same numerals.

Figure 1A:
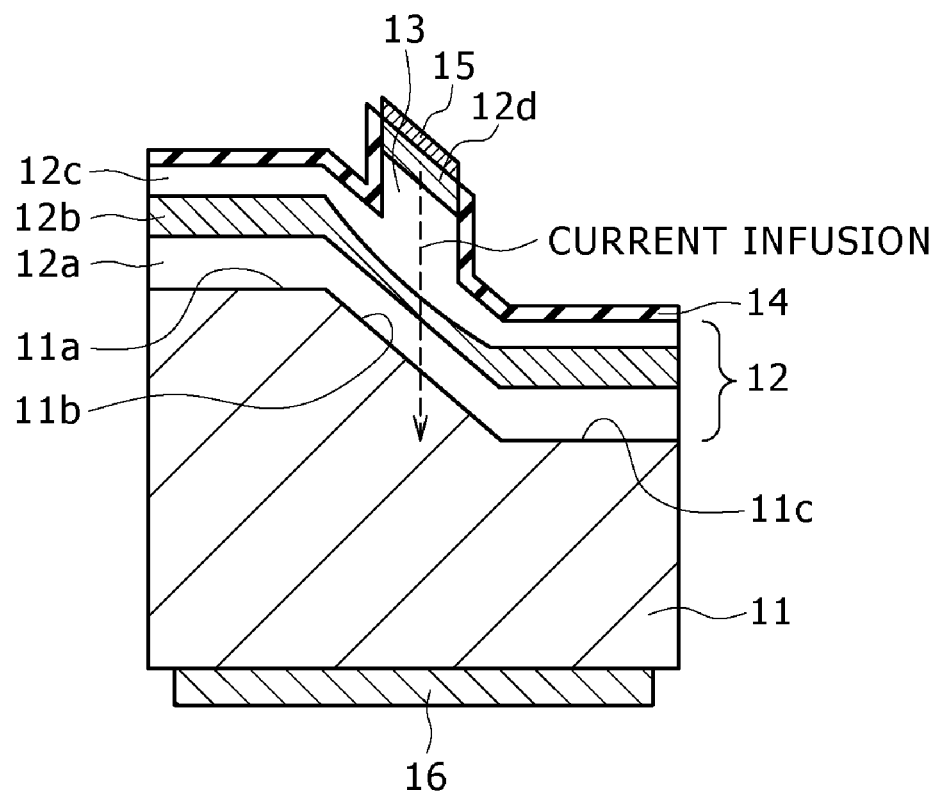
FIGS. 1A and 1B are sectional views showing a GaN-based semiconductor laser according to a first embodiment of the present invention and an n-GaN substrate included in the GaN-based semiconductor laser.
Figure 1B:
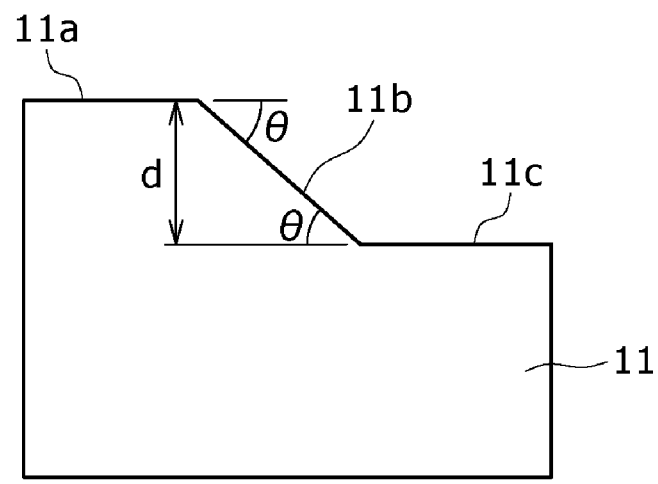
Figure 2A:
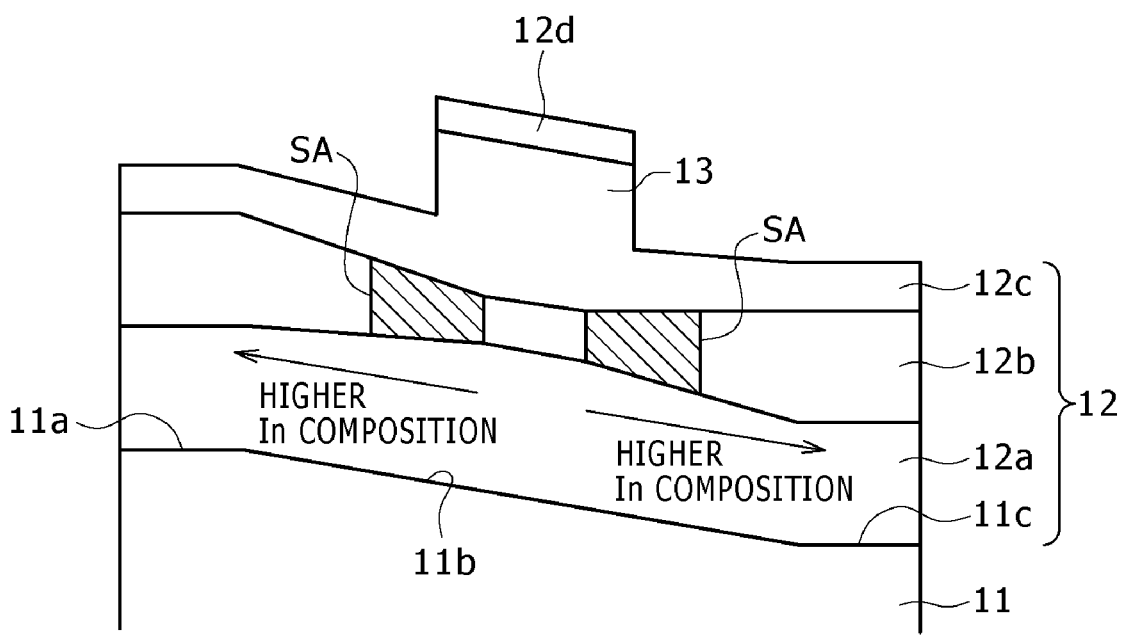
FIGS. 2A and 2B are an enlarged sectional view of major part of the GaN-based semiconductor laser according to the first embodiment of the present invention and an energy band diagram of an active layer in the GaN-based semiconductor laser.

FIG. 1A shows a GaN-based semiconductor laser according to a first embodiment of the present invention. FIG. 1B is a sectional view showing an n-GaN substrate of this GaN-based semiconductor laser. FIG. 2A is an enlarged sectional view of major part of this GaN-based semiconductor laser. This GaN-based semiconductor laser has a ridge stripe structure.

As shown in FIGS. 1A, 1B, and 2A, this GaN-based semiconductor laser has a GaN-based semiconductor layer 12 providing a laser structure on the major surface of an n-GaN substrate 11. This GaN-based semiconductor layer 12 includes at least an n-cladding layer 12a, an active layer 12b containing at least In, a p-cladding layer 12c, and a p-contact layer 12d in that order from the n-GaN substrate 11.

In this semiconductor laser, as shown in FIG. 1B, the major surface of the n-GaN substrate 11 has a first planar area 11a, a second planar area 11b, and a third planar area 11c. The first planar area 11a is formed of the C-plane. The second planar area 11b is continuous with the first planar area 11a and is formed of a semipolar plane inclined at a predetermined angle θ (0<θ<90°) to the first planar area 11a. The third planar area 11c is continuous with the second planar area 11b and is formed of the C-plane, which is parallel to the first planar area 11a. The height of the third planar area 11c is smaller than that of the first planar area 11a by d. The upper surface of the n-cladding layer 12a also has a first planar area formed of the C-plane, a second planar area that is continuous with the first planar area and is formed of the semipolar plane inclined at the predetermined angle θ (0<θ<90°) to the first planar area, and a third planar area that is continuous with the second planar area and is formed of the C-plane parallel to the first planar area, as with the major surface of the n-GaN substrate 11.

A ridge stripe 13 is formed of upper part of the p-cladding layer 12c and the p-contact layer 12d above the second planar area 11b formed of the semipolar plane. In this structure, the partial portions of the active layer 12b in the vicinity of the parts directly beneath both the side surfaces of the ridge stripe 13 serve as saturable absorber regions SA.

Figure 2B:
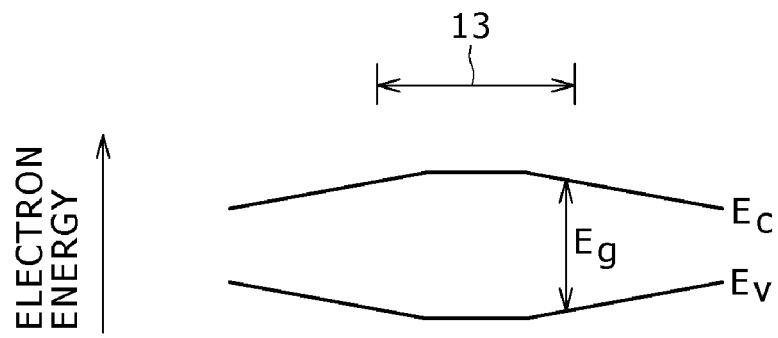

The In composition and thickness of the active layer 12b are constant above the first planar area 11a and the third planar area 11c, which are each formed of the C-plane. On the other hand, they are smaller above the second planar area 11b, which is formed of the semipolar plane, than above the first planar area 11a and the third planar area 11c, and gradually decrease in the direction from the first planar area 11a and the third planar area 11c toward the second planar area 11b. As a result, the In composition and thickness of the active layer 12b gradually increase in the direction from the center part of the ridge stripe 13 toward both the sides of the ridge stripe 13. FIG. 2B shows the energy band diagram of the active layer 12b in linkage with FIG. 2A. In FIG. 2B, $E_c$ denotes the energy of the bottom of the conduction band and $E_v$ denotes the energy of the top of the valence band. As shown in FIG. 2B, in linkage with the gradual increase in the In composition of the active layer 12b in the direction from the center part of the ridge stripe 13 toward both the sides of the ridge stripe 13, the band gap $E_g$ (=$E_c$−$E_v$) of the active layer 12b gradually decreases in the direction from the center part of the ridge stripe 13 toward both the sides of the ridge stripe 13.

The extension direction of the ridge stripe 13 is <1-100> or <11-20>. If the extension direction of the ridge stripe 13 is <1-100>, the second planar area 11b formed of a semipolar plane is a {11-2n} plane (n=1, 2, 3, . . . ), specifically the {11-21} plane, the {11-22} plane, the {11-23} plane, or the like. If the extension direction of the ridge stripe 13 is <11-20>, the second planar area 11b formed of a semipolar plane is a {1-10n} plane (n=1, 2, 3, . . . ), specifically the {1-101} plane, the {1-102} plane, the {1-103} plane, or the like. The width of the second planar area 11b is, but not limited to, in the range of e.g. 2 to 10 µm.

On both the side surfaces of the ridge stripe 13 and on the partial portions of the p-cladding layer 12c on both the sides of the ridge stripe 13, an insulating film 14 composed of e.g. an $SiO_2$ film and e.g. an undoped Si film thereon is provided. On the p-contact layer 12d as upper part of the ridge stripe 13, a p-electrode 15 in electrical contact with the p-contact layer 12d is formed. The p-electrode 15 is, but not limited to, e.g. a component composed of Pd.

An n-electrode 16 in electrical contact with the n-GaN substrate 11 is formed on the backside of the n-GaN substrate 11. The n-electrode 16 is, but not limited to, e.g. a component of a Ti/Pt/Au structure in which the thicknesses of the Ti film, the Pt film, and the Au film are e.g. 15 nm, 50 nm, and 300 nm, respectively.

A specific example of the GaN-based semiconductor layer 12 providing a laser structure is a layer obtained by stacking, in the following order from the n-GaN substrate 11 side, an n-AlGaN cladding layer, an n-GaN optical waveguide layer, an active layer of an undoped $Ga_{1-x}In_xN$ (quantum well layer)/$Ga_{1-y}In_yN$ (barrier layer, x>y) multiple quantum well structure, an undoped InGaN optical waveguide layer, an undoped AlGaN optical waveguide layer, a p-AlGaN electron barrier layer, a p-GaN/undoped AlGaN superlattice cladding layer, and a p-GaN contact layer. One example of the thicknesses of these layers is as follows: the n-AlGaN cladding layer is 1200 nm; the n-GaN optical waveguide layer is 12 nm; the well layer of the active layer is 3.5 nm (the number of wells is three); the barrier layer is 7 nm; the undoped InGaN optical waveguide layer is 40 nm; the undoped AlGaN optical waveguide layer is 60 nm; the p-AlGaN electron barrier layer is 10 nm; and the p-GaN/AlGaN superlattice cladding layer is 400 nm. The Al composition of the n-AlGaN cladding layer is e.g. 0.05. The In composition of the undoped InGaN optical waveguide layer is e.g. 0.02. The Al composition of the undoped AlGaN optical waveguide layer is e.g. 0.02. The Al composition of the p-AlGaN electron barrier layer is e.g. 0.2. The Al composition of the p-GaN/AlGaN superlattice cladding layer is e.g. 0.08.

A method for manufacturing the GaN-based semiconductor laser having the above-described structure will be described below.

Figure 3A:
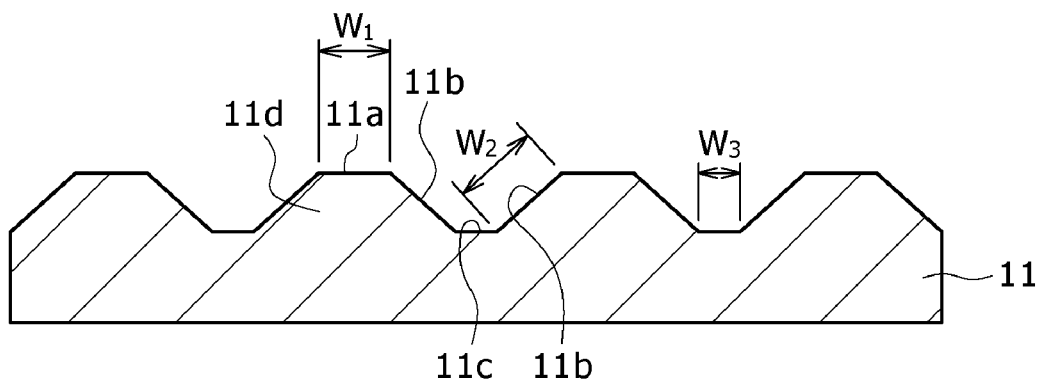
FIGS. 3A to 3C are sectional views for explaining a method for manufacturing the GaN-based semiconductor laser according to the first embodiment of the present invention.

First, as shown in FIG. 3A, the n-GaN substrate 11 is prepared that has in its major surface a periodical recess-and-projection structure obtained by providing plural projections 11d that each extend along one direction and are parallel to each other. The projection 11d has a trapezoidal sectional shape, and the top surface thereof is the first planar area 11a formed of the C-plane. The bottom surface of the trench between the projections 11d is the third planar area 11c formed of the C-plane. Both the side surfaces of the projection 11d are the second planar area 11b formed of a semipolar plane inclined to the first planar area 11a. The width $w_1$ of the top surface of the projection 11d, the width $w_2$ of both the side surfaces of the projection 11d, and the width $w_3$ of the bottom surface of the trench between the projections 11d are, but not limited to, in the range of e.g. 2 to 10 µm.

Figure 3B:
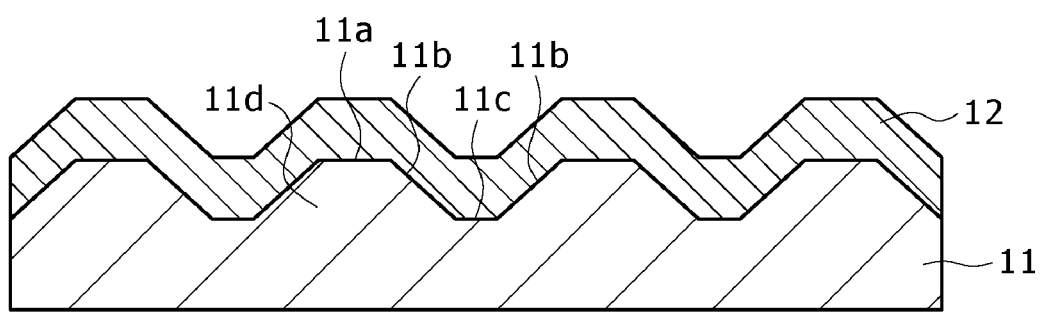

Subsequently, as shown in FIG. 3B, the GaN-based semiconductor layer 12 providing a laser structure is epitaxially grown on the major surface of the n-GaN substrate 11 by e.g. metal organic chemical vapor deposition (MOCVD). Specifically, for example, the following layers are sequentially epitaxially grown: an n-AlGaN cladding layer, an n-GaN optical waveguide layer, an active layer of an undoped $Ga_{1-x}In_xN$/$Ga_{1-y}In_yN$ multiple quantum well structure, an undoped InGaN optical waveguide layer, an undoped AlGaN optical waveguide layer, a p-AlGaN electron barrier layer, a p-GaN/undoped AlGaN superlattice cladding layer, and a p-GaN contact layer.

In the grown GaN-based semiconductor layer 12, the In composition and thickness of the active layer 12b containing In are constant above the first planar area 11a and the third planar area 11c, which are each formed of the C-plane. On the other hand, both the In composition and the thickness are smaller above the second planar area 11b, which is formed of a semipolar plane, than above the first planar area 11a and the third planar area 11c. Furthermore, the In composition and the thickness gradually decrease in the direction from the first planar area 11a and the third planar area 11c toward the second planar area 11b.

The growth temperature for the layers that do not contain In, specifically for the n-AlGaN cladding layer, the n-GaN optical waveguide layer, the undoped AlGaN optical waveguide layer, the p-AlGaN electron barrier layer, the p-GaN/undoped AlGaN superlattice cladding layer, and the p-GaN contact layer, is in the range of e.g. about 900 to 1100° C. The growth temperature for the layers containing In, specifically for the active layer of the $Ga_{1-x}In_xN$/$Ga_{1-y}In_yN$ multiple quantum well structure and the undoped InGaN optical waveguide layer is in the range of e.g. 700 to 800° C. However, the growth temperatures are not limited thereto.

Examples of growth materials for these GaN-based semiconductor layers are as follows: triethylgallium (($C_2H_5$)$_3$Ga, TEG) or trimethylgallium (($CH_3$)$_3$Ga, TMG) as the material for Ga; trimethylaluminum (($CH_3$)$_3$Al, TMA) as the material for Al; triethylindium (($C_2H_5$)$_3$In, TEI) or trimethylindium (($CH_3$)$_3$In, TMI) as the material for In; and ammonia ($NH_3$) as the material for N. However, the growth materials are not limited thereto. As for dopants, e.g. silane ($SiH_4$) is used as the n-type dopant, and e.g. bis(methylcyclopentadienyl)magnesium (($CH_3C_5H_4$)$_2$Mg), bis(ethylcyclopentadienyl)magnesium (($C_2H_5C_5H_4$)$_2$Mg), or bis(cyclopentadienyl)magnesium (($C_5H_5$)$_2$Mg) is used as the p-type dopant. However, the dopants are not limited thereto. For the carrier gas atmosphere at the time of the growth of the GaN-based semiconductor layers, e.g. an H2 gas is used. However, the carrier gas atmosphere is not limited thereto. The flow rate ratio of the material for the group V element to the material for the group III element (V/III ratio) is, but not limited to, generally in the range of 103 to 106 (e.g. about 105). The pressure at the time of the growth is, but not limited to, e.g. 760 Torr (ordinary pressure).

Figure 3C:
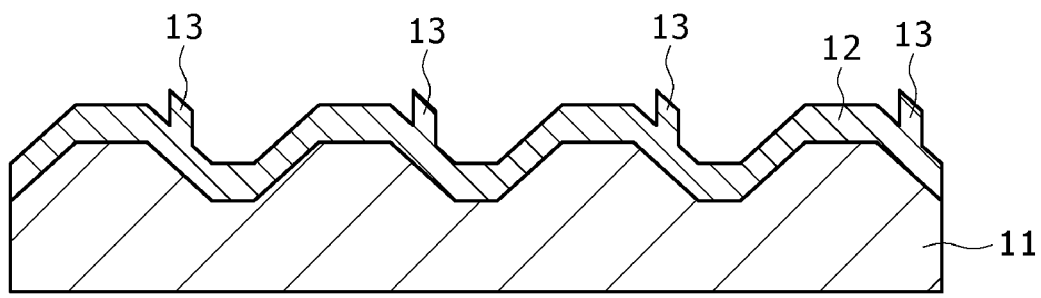

Subsequently, an insulating film (not shown) such as an $SiO_2$ film is formed on the entire surface of the GaN-based semiconductor layer 12, and then this insulating film is patterned into a predetermined shape by etching. Subsequently, as shown in FIG. 3C, the p-contact layer 12d and upper part of the p-cladding layer 12c are etched by dry etching such as reactive ion etching (RIE) with use of this insulating film as the etching mask, to thereby form the ridge stripes 13.

Subsequently, without removing the insulating film used as the etching mask, e.g. an $SiO_2$ film and e.g. an undoped Si film are sequentially formed across the entire surface. Thereafter, the partial portions of these films above the ridge stripes 13 are selectively removed by etching, to thereby expose the upper surfaces of the ridge stripes 13. In this way, the insulating film 14 is formed on both the side surfaces of the ridge stripes 13 and on the partial portions of the p-cladding layer 12c on both the sides of the ridge stripes 13. Subsequently, the p-electrode 15 is formed on the p-contact layer 12d.

Subsequently, the n-GaN substrate 11 is polished from the back surface thereof to thereby decrease the thickness thereof to a predetermined thickness according to need. Subsequently, the n-electrode 16 is formed in each chip area on the back surface of the n-GaN substrate 11 by e.g. a lift-off method.

Subsequently, a laser bar is formed and both the resonator end faces are formed e.g. by cleaving the n-GaN substrate 11 on which the laser structure has been formed in the above-described manner. Subsequently, end face coating is carried out for these resonator end faces, and then the laser bar is turned to chips through cleavage or the like of the laser bar.

Through the above-described steps, the intended GaN-based semiconductor laser is manufactured.

A method for manufacturing the n-GaN substrate 11 shown in FIG. 3A will be described below.

Figure 4A:
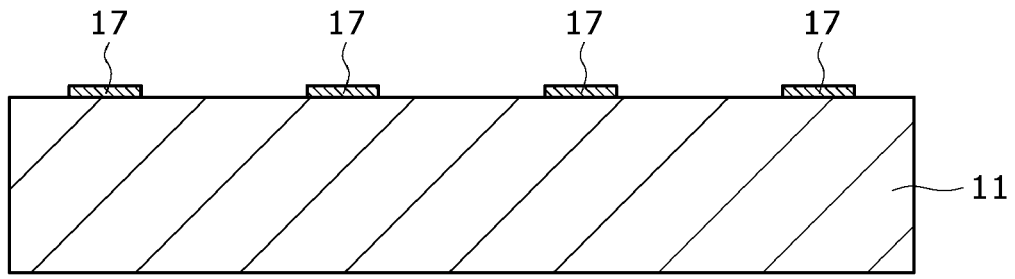
FIGS. 4A to 4C are sectional views for explaining one example of a method for manufacturing the n-GaN substrate used in the manufacturing of the GaN-based semiconductor laser according to the first embodiment of the present invention.

First, as shown in FIG. 4A, growth masks 17 having a stripe shape extending along one direction are formed on the major surface of the flat n-GaN substrate 11 whose major surface is formed of the C-plane. As the growth masks 17, a silicon dioxide ($SiO_2$) film, a silicon nitride (SiN) film, or the like can be used. However, the growth masks 17 are not limited thereto. The longitudinal direction of the growth masks 17 is the <1-100> direction or the <11-20> direction of the n-GaN substrate 11.

Figure 4B:
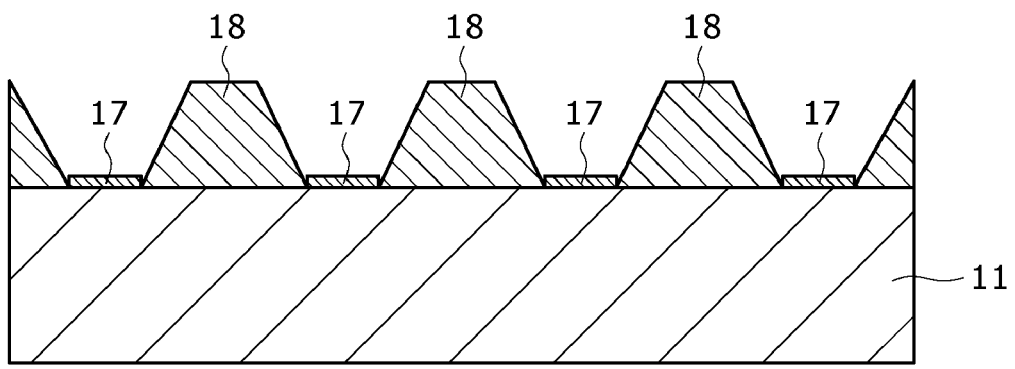

Subsequently, as shown in FIG. 4B, n-GaN layers 18 are epitaxially grown on the n-GaN substrate 11 by e.g. MOCVD with use of the growth masks 17. In this case, the n-GaN layers 18 each having a trapezoidal sectional shape are epitaxially grown selectively on the partial portions of the surface of the n-GaN substrate 11 that are not covered by the growth masks 17. If the longitudinal direction of the growth masks 17 is the <1-100> direction of the n-GaN substrate 11, both the side surfaces of the n-GaN layers 18 as oblique surfaces are formed of a {11-2n} plane (n=1, 2, 3, ...), which is a semipolar plane. If the longitudinal direction of the growth masks 17 is the <11-20> direction of the n-GaN substrate 11, both the side surfaces of the n-GaN layers 18 as oblique surfaces are formed of a {1-10n} plane (n=1, 2, 3, ...), which is a semipolar plane. In either case, the top surfaces of the n-GaN layers 18 are formed of the C-plane parallel to the major surface of the n-GaN substrate 11.

Figure 4C:
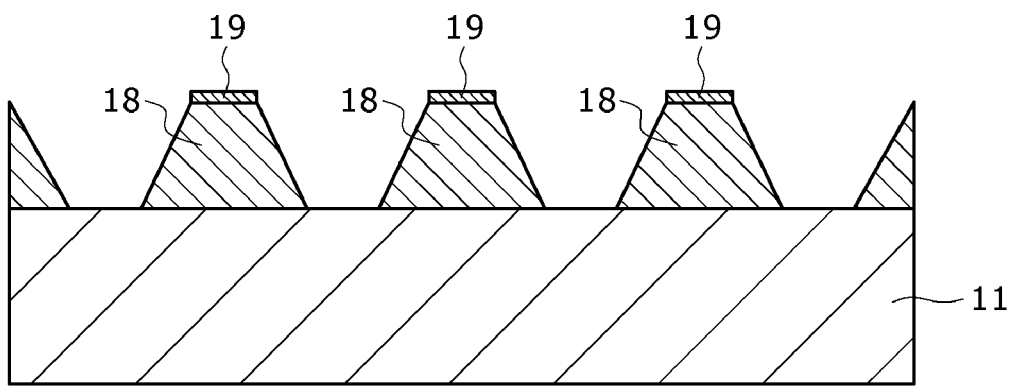

Subsequently, the growth masks 17 are removed. Thereafter, as shown in FIG. 4C, growth masks 19 each having the same planar shape as that of the top surfaces of the n-GaN layers 18 having the trapezoidal sectional shape are formed on the top surfaces of the n-GaN layers 18. Components similar to the growth masks 17 can be used as the growth masks 19.

Figure 5A:
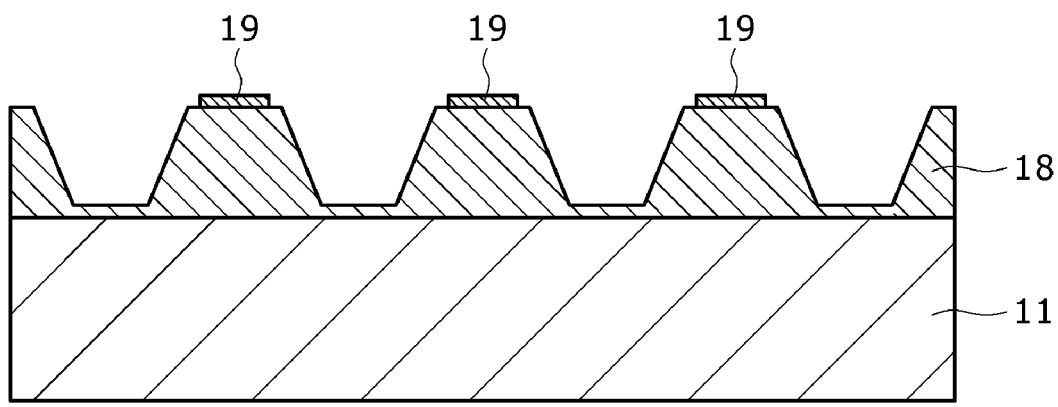
FIGS. 5A and 5B are sectional views for explaining one example of the method for manufacturing the n-GaN substrate used in the manufacturing of the GaN-based semiconductor laser according to the first embodiment of the present invention.

Subsequently, as shown in FIG. 5A, the n-GaN layer 18 is epitaxially grown on the n-GaN substrate 11 with use of the growth masks 19 so that the C-plane of the n-GaN layer 18 may be preferentially grown. In this way, the n-GaN layer 18 is epitaxially grown on the partial portions of the surface of the n-GaN substrate 11 between the previously-grown n-GaN layers 18.

Figure 5B:
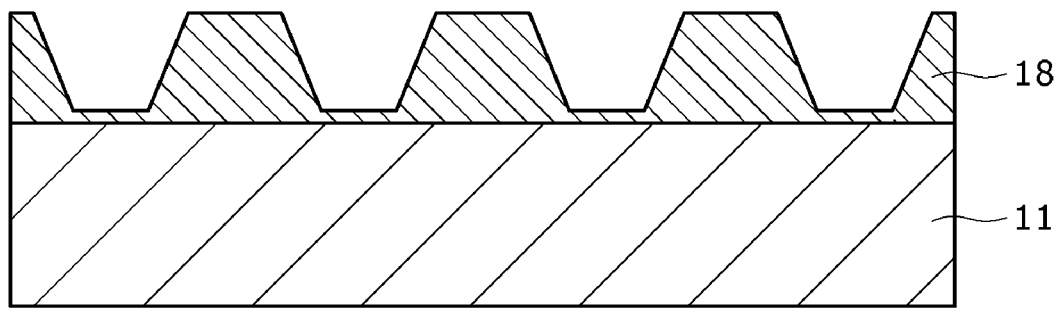

Subsequently, the growth masks 19 are removed as shown in FIG. 5B. In this manner, the n-GaN substrate 11 shown in FIG. 3A is manufactured.

It is also possible to manufacture the n-GaN substrate 11 shown in FIG. 3A by the following method.

Figure 6A:
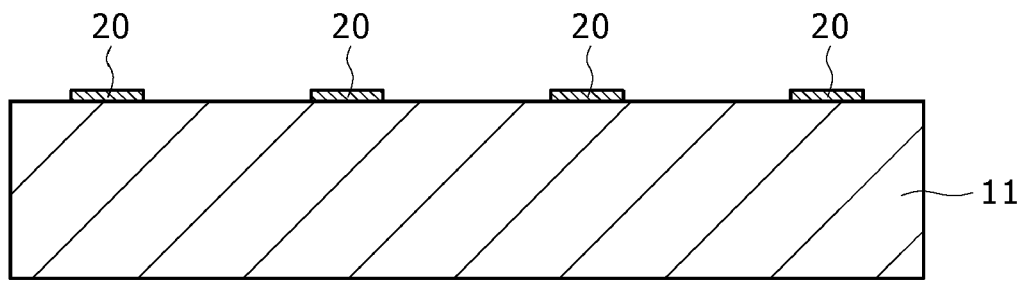
FIGS. 6A to 6C are sectional views for explaining another example of the method for manufacturing the n-GaN substrate used in the manufacturing of the GaN-based semiconductor laser according to the first embodiment of the present invention.

First, as shown in FIG. 6A, etching masks 20 having a stripe shape extending along one direction are formed on the major surface of the flat n-GaN substrate 11 whose major surface is formed of the C-plane. As the etching masks 20, e.g. a resist film can be used. However, the etching masks 20 are not limited thereto. The longitudinal direction of the etching masks 20 is the <1-100> direction or the <11-20> direction of the n-GaN substrate 11.

Figure 6B:
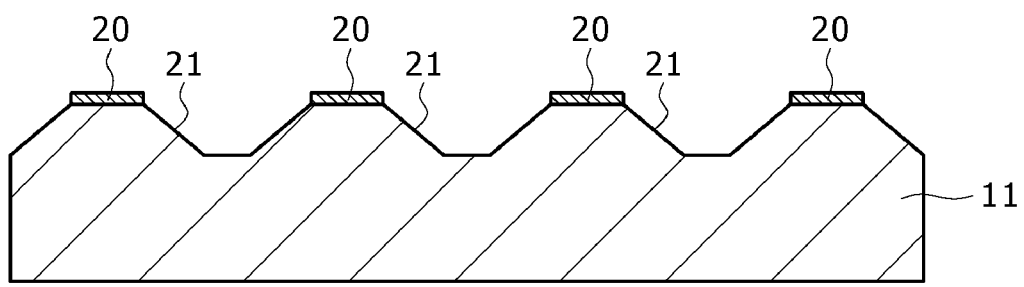

Subsequently, as shown in FIG. 6B, the n-GaN substrate 11 is etched by e.g. RIE with use of the etching masks 20, to thereby form trenches 21. Both the side surfaces of the trenches 21 are formed of a {11-2n} plane (n=1, 2, 3, ...) or a {1-10n} plane (n=1, 2, 3, ...), which is a semipolar plane, and the bottom surfaces of the trenches 21 are formed of the C-plane. The inclination angle of both the side surfaces of the trenches 21 can be set to any angle through selection of the etching mode of the RIE.

Figure 6C:
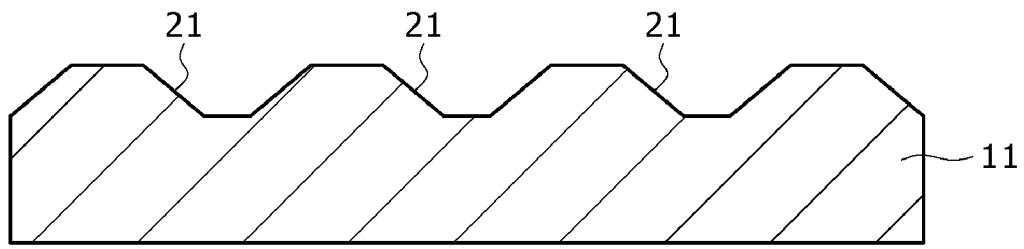

Thereafter, as shown in FIG. 6C, the etching masks 20 are removed by an organic solvent such as acetone. In this manner, the n-GaN substrate 11 shown in FIG. 3A is manufactured.

The first embodiment can provide the following advantages. Specifically, in this first embodiment, the In composition of the partial portions of the active layer 12b on both the sides of the ridge stripe 13 is higher than that of the partial portion of the active layer 12b corresponding to the ridge stripe 13. In addition, the thickness of the partial portions of the active layer 12b on both the sides of the ridge stripe 13 is larger than that of the partial portion of the active layer 12b corresponding to the ridge stripe 13. Therefore, the volume of the partial portions of the saturable absorber regions SA on both the sides of the ridge stripe 13 is larger than that of the partial portions of the saturable absorber regions SA inside the ridge stripe 13. In addition, the band gap of the partial portions of the saturable absorber regions SA on both the sides of the ridge stripe 13 is smaller than that of the partial portions of the saturable absorber regions SA inside the ridge stripe 13. Thus, light from the partial portion of the active layer 12b corresponding to the ridge stripe 13 is easily absorbed. As a result, there is no need to set the height of the ridge stripe 13 small to thereby obtain a small value as the effective refractive index difference Δn in the lateral direction for ensuring the saturable absorber region, differently from the case in which the In composition and thickness of the partial portion of the active layer 12b inside the ridge stripe 13 are the same as those of the partial portions of the active layer 12b on both the sides of the ridge stripe 13. Thus, the height of the ridge stripe 13 can be set sufficiently large, which makes it possible to avoid instability of the high-temperature operation characteristic due to diffusion current. Furthermore, because the In composition of the partial portions of the active layer 12b on both the sides of the ridge stripe 13 is high, in addition to the advantage that the height of the ridge stripe 13 can be set sufficiently large, sufficient light absorption occurs in the partial portions of the active layer 12b on both the sides of the ridge stripe 13. Due to this feature, instability of the near-field pattern can be eliminated. In addition, it is possible to prevent light from greatly leaking out in the lateral direction. Therefore, reactive current can be decreased, and thus reduction in the threshold current and prevention of the deterioration of the relative intensity noise can be achieved. Moreover, the In composition of the active layer 12b is higher above the first and third planar areas 11a and 11c formed of the C-plane than above the second planar area 11b formed of a semipolar plane. Thus, defects due to the segregation of In occur in the partial portions of the active layer 12b above the first and third planar areas 11a and 11c, which can shorten the lifetime of the carriers in the saturable absorber regions SA. Consequently, intense self-pulsation operation can be achieved. The above-described advantages allow achievement of a GaN-based semiconductor laser that can prevent weakening and stopping of self-pulsation operation attributed to turning of a saturable absorber region into the transparent state or reduction in the saturable absorber region due to diffusion current at the time of high-temperature operation and suppress instability of the near-field pattern, and thus can easily achieve both the required self-pulsation operation characteristic and static characteristic.

The following advantage can also be achieved by the first embodiment. Specifically, it is known that the following problem occurs in a GaN-based semiconductor laser obtained by epitaxially growing a GaN-based semiconductor layer providing a laser structure on an n-GaN substrate whose major surface is formed of the C-plane. Specifically, at the time of the operation of the semiconductor laser, the wave functions of electrons and holes injected into the active layer are separated from each other in the directions perpendicular to the active layer plane because of the Stark effect due to piezoelectric fields, which causes the lowering of the emission efficiency. However, in this first embodiment, the ridge stripe 13 is formed above the second planar area 11b formed of a semipolar plane. Therefore, piezoelectric fields applied to the partial portion of the active layer 12b into which electrons and holes are injected can be reduced, which can enhance the emission efficiency of the GaN-based semiconductor laser.

This GaN-based semiconductor laser is suitable for being used as e.g. the light source of an optical disk device.

A GaN-based semiconductor laser according to a second embodiment of the present invention will be described below.

Figure 7:
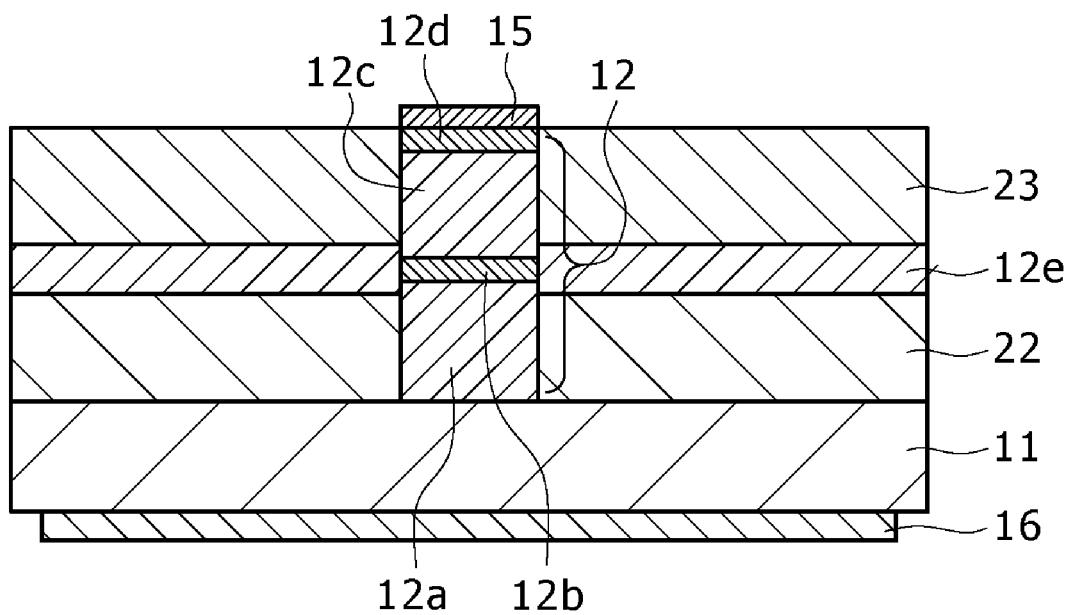
FIG. 7 is a sectional view showing a GaN-based semiconductor laser according to a second embodiment of the present invention.

As shown in FIG. 7, this GaN-based semiconductor laser has a GaN-based semiconductor layer 12 that serves as a laser stripe and has a ridge shape on the major surface of an n-GaN substrate 11 having the flat major surface formed of the C-plane. Similarly to the first embodiment, this GaN-based semiconductor layer 12 includes at least an n-cladding layer 12a, an active layer 12b containing at least In, a p-cladding layer 12c, and a p-contact layer 12d in that order from the n-GaN substrate side.

Above the partial portions of the surface of the n-GaN substrate 11 on both the sides of the GaN-based semiconductor layer 12 having the ridge shape, a p-buried layer 22, an active layer 12e, and an n-buried layer 23 are sequentially stacked. The p-buried layer 22 is provided on both the sides of the n-cladding layer 12a. The active layer 12e is provided on both the sides of the active layer 12b. The n-buried layer 23 is provided on both the sides of the p-cladding layer 12c and the p-contact layer 12d. The p-buried layer 22 is composed of a GaN-based semiconductor, such as AlGaN, having substantially the same refractive index as that of the n-cladding layer 12a. Similarly, the n-buried layer 23 is composed of a GaN-based semiconductor, such as AlGaN, having substantially the same refractive index as that of the p-cladding layer 12c. The active layer 12e has e.g. an undoped $Ga_{1-x}In_xN$ (quantum well layer)/$Ga_{1-y}In_yN$ (barrier layer, x>y) multiple quantum well structure.

The In composition and thickness of the active layer 12e are larger than those of the active layer 12b of the laser stripe. Thus, the band gap of the active layer 12e is smaller than that of the active layer 12b. In this structure, the partial portions of the active layer 12b and the active layer 12e in the vicinity of both the side surfaces of the laser stripe serve as saturable absorber regions SA.

A p-electrode 15 in electrical contact with the p-contact layer 12d is formed on the p-contact layer 12d. An n-electrode 16 in electrical contact with the n-GaN substrate 11 is formed on the back surface of the n-GaN substrate 11.

A method for manufacturing the GaN-based semiconductor laser having the above-described structure will be described below.

Figure 8A:
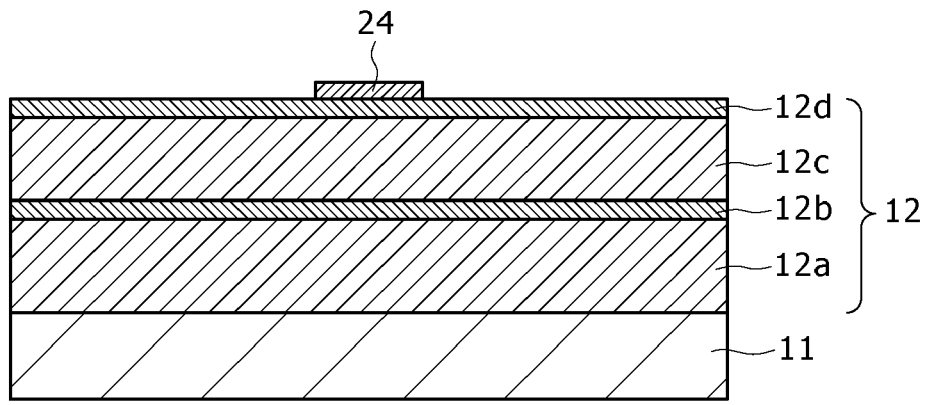
FIGS. 8A to 8C are sectional views for explaining a method for manufacturing the GaN-based semiconductor laser according to the second embodiment of the present invention.

First, as shown in FIG. 8A, the GaN-based semiconductor layer 12 providing a laser structure is epitaxially grown by e.g. MOCVD on the major surface of the flat n-GaN substrate 11 whose major surface is formed of the C-plane. Subsequently, an etching mask 24 having a stripe shape extending along one direction is formed on this GaN-based semiconductor layer 12. As the etching mask 24, e.g. an $SiO_2$ film or an SiN film can be used. However, the etching mask 24 is not limited thereto.

Figure 8B:
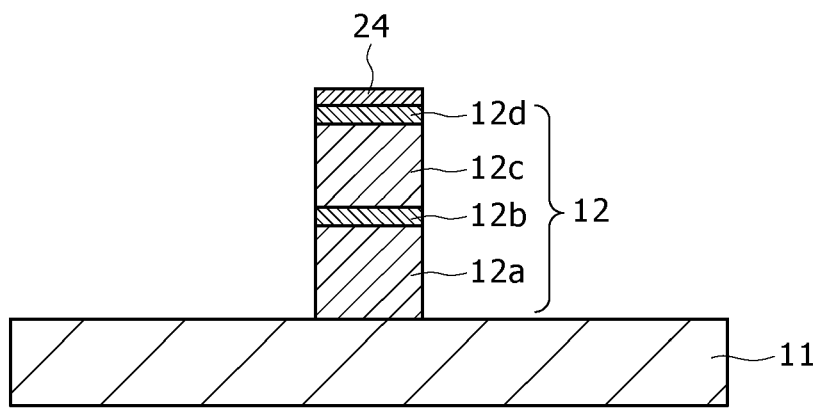

Subsequently, as shown in FIG. 8B, the GaN-based semiconductor layer 12 is etched by e.g. RIE with use of this etching mask 24 until the n-GaN substrate 11 is exposed, to thereby form the ridge shape.

Figure 8C:
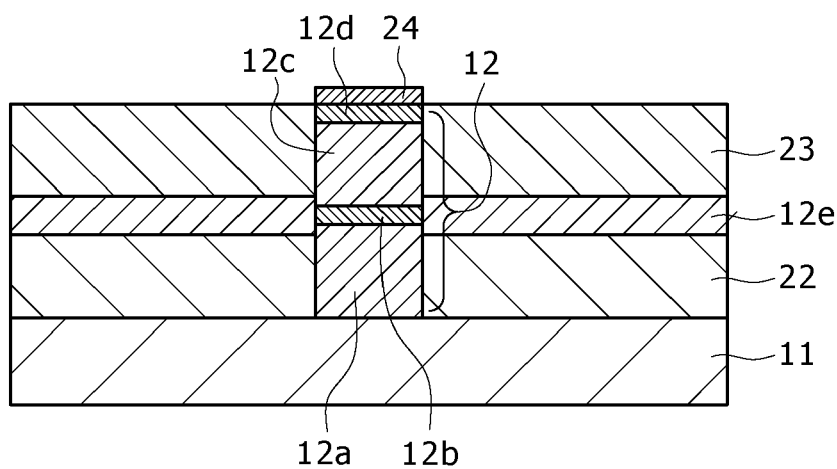
Figure 9:
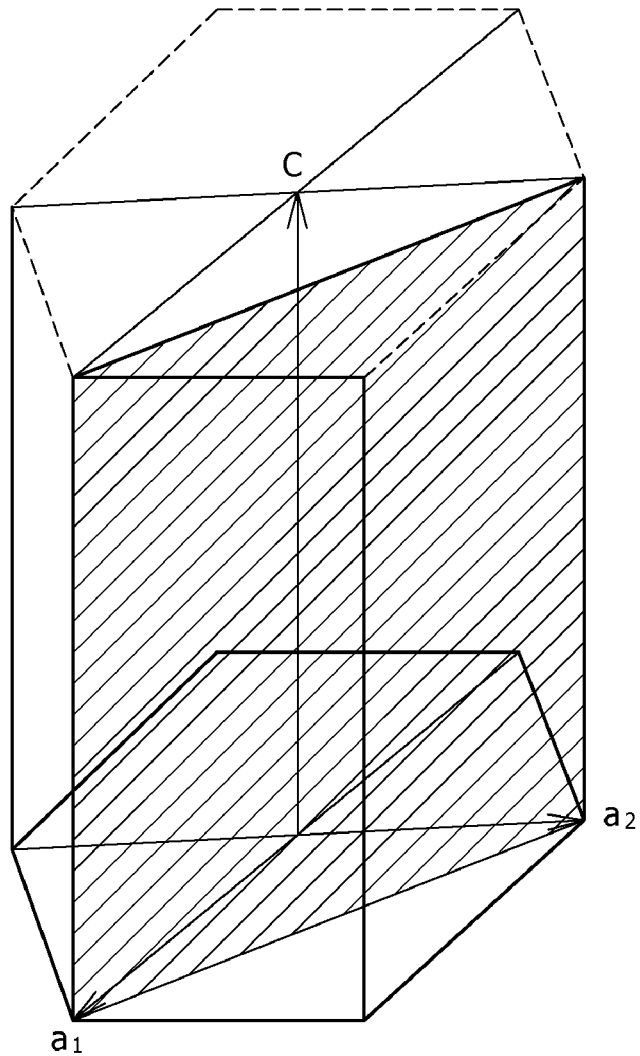
FIG. 9 is a schematic diagram showing the relationship between a polar plane and nonpolar planes of a nitride III-V compound semiconductor.
Figure 9:
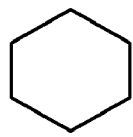
Figure 9:
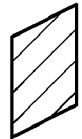
Figure 9:
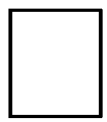
Figure 10:
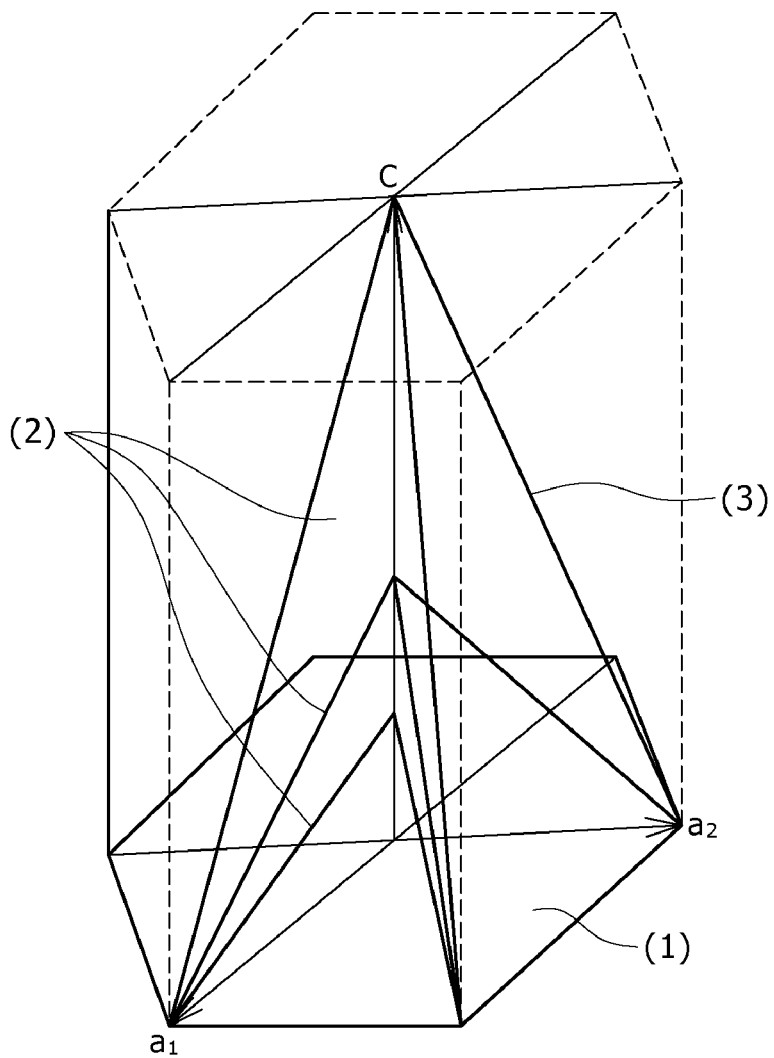
FIG. 10 is a schematic diagram showing the relationship between the polar plane and semipolar planes of the nitride III-V compound semiconductor.
Figure 10:
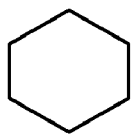
Figure 10:
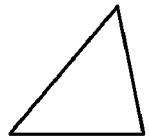
Figure 10:

Subsequently, as shown in FIG. 8C, the p-buried layer 22, the active layer 12e, and the n-buried layer 23 are sequentially epitaxially grown above the partial portions of the surface of the n-GaN substrate 11 on both the sides of the laser stripe by e.g. MOCVD with use of the etching mask 24 as the growth mask.

Subsequently, the etching mask 24 is removed by etching.

Thereafter, similarly to the first embodiment, the necessary steps such as the formation of the p-electrode 15 on the p-contact layer 12d and the formation of the n-electrode 16 on the back surface of the n-GaN substrate 11 are carried out, so that the intended GaN-based semiconductor laser is manufactured.

Similarly to the first embodiment, this second embodiment allows achievement of a GaN-based semiconductor laser that can prevent weakening or stopping of self-pulsation operation attributed to turning of a saturable absorber region into the transparent state or reduction in the saturable absorber region due to diffusion current at the time of high-temperature operation and suppress instability of the near-field pattern, and thus can easily achieve both the required self-pulsation operation characteristic and static characteristic.

The specific descriptions have been made above about embodiments of the present invention. However, it should be noted that the present invention is not limited the above-described embodiments but various modifications based on the technical idea of the present invention are possible.

For example, numerical values, structures, shapes, processes, and so on cited for the above-described embodiments are merely examples. Therefore, numerical values, structures, shapes, processes, and so on different from the above-cited ones may be employed according to need.

The present application contains subject matter related to that disclosed in Japanese Priority Patent Application JP 2008-161523 filed in the Japan Patent Office on Jun. 20, 2008, the entire content of which is hereby incorporated by reference.

What is claimed is:
1. A semiconductor laser comprising:
a nitride III-V compound semiconductor substrate configured to have a first planar area, a second planar area, and a third planar area in a major surface, the first planar area being formed of a C-plane, the second planar area being continuous with the first planar area and being formed of a semipolar plane inclined to the first planar area, the third planar area being continuous with the second planar area and being formed of a C-plane parallel to the first planar area;
a first cladding layer configured to be composed of a nitride III-V compound semiconductor on the major surface of the nitride III-V compound semiconductor substrate;
an active layer configured to be composed of a nitride III-V compound semiconductor that exists on the first cladding layer and contains In; and
a second cladding layer configured to be composed of a nitride III-V compound semiconductor on the active layer,
wherein,
a ridge stripe is provided in a partial portion of the second cladding layer above the second planar area, and
In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe.

2. The semiconductor laser according to claim 1, wherein In composition of the active layer increases in a direction from a center part of the ridge stripe toward both the sides of the ridge stripe and/or thickness of the active layer increases in the direction from the center part of the ridge stripe toward both the sides of the ridge stripe.

3. The semiconductor laser according to claim 2, wherein the semipolar plane is a {11-2n} plane (n is an integer equal to or larger than one) or a {1-10n} plane (n is an integer equal to or larger than one).

4. The semiconductor laser according to claim 3, wherein an extension direction of the ridge stripe is <1-100> if the semipolar plane is a {11-2n} plane and the extension direction of the ridge stripe is <11-20> if the semipolar plane is a {1-10n} plane.

5. A method for manufacturing a semiconductor laser, the method comprising the steps of:
sequentially growing a first cladding layer composed of a nitride III-V compound semiconductor, an active layer composed of a nitride III-V compound semiconductor containing In, and a second cladding layer composed of a nitride III-V compound semiconductor over a major surface of a nitride III-V compound semiconductor substrate having a first planar area, a second planar area, and a third planar area in the major surface, the first planar area being formed of a C-plane, the second planar area being continuous with the first planar area and being formed of a semipolar plane inclined to the first planar area, the third planar area being continuous with the second planar area and being formed of a C-plane parallel to the first planar area; and
forming a ridge stripe in a partial portion of the second cladding layer above the second planar area,
wherein
In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe, or
In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe, or
In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe, or
In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe.

6. The method for manufacturing a semiconductor laser according to claim 5, wherein
the semipolar plane is a {11-2n} plane (n is an integer equal to or larger than one) or a {1-10n} plane (n is an integer equal to or larger than one).

7. The method for manufacturing a semiconductor laser according to claim 6, wherein
an extension direction of the ridge stripe is <1-100> if the semipolar plane is a {11-2n} plane and the extension direction of the ridge stripe is <11-20> if the semipolar plane is a {1-10n} plane.

8. An optical disk device including a semiconductor laser as a light source, the semiconductor laser comprising:
a nitride III-V compound semiconductor substrate configured to have a first planar area, a second planar area, and a third planar area in a major surface, the first planar area being formed of a C-plane, the second planar area being continuous with the first planar area and being formed of a semipolar plane inclined to the first planar area, the third planar area being continuous with the second planar area and being formed of a C-plane parallel to the first planar area;
a first cladding layer configured to be composed of a nitride III-V compound semiconductor on the major surface of the nitride III-V compound semiconductor substrate;
an active layer configured to be composed of a nitride III-V compound semiconductor that exists on the first cladding layer and contains In; and
a second cladding layer configured to be composed of a nitride III-V compound semiconductor on the active layer, wherein
a ridge stripe is provided in a partial portion of the second cladding layer above the second planar area, and
In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe.

9. An optical pickup including a semiconductor laser as a light source, the semiconductor laser comprising:

a nitride III-V compound semiconductor substrate configured to have a first planar area, a second planar area, and a third planar area in a major surface, the first planar area being formed of a C-plane, the second planar area being continuous with the first planar area and being formed of a semipolar plane inclined to the first planar area, the third planar area being continuous with the second planar area and being formed of a C-plane parallel to the first planar area;

a first cladding layer configured to be composed of a nitride III-V compound semiconductor on the major surface of the nitride III-V compound semiconductor substrate;

an active layer configured to be composed of a nitride III-V compound semiconductor that exists on the first cladding layer and contains In; and a second cladding layer configured to be composed of a nitride III-V compound semiconductor on the active layer, wherein a ridge stripe is provided in a partial portion of the second cladding layer above the second planar area, and In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe.

10. A semiconductor laser comprising:

a first cladding layer configured to be composed of a nitride III-V compound semiconductor;

an active layer configured to be composed of a nitride III-V compound semiconductor that exists on the first cladding layer and contains In; and a second cladding layer configured to be composed of a nitride III-V compound semiconductor on the active layer, wherein an upper surface of the first cladding layer has a first planar area formed of a C-plane, a second planar area that is continuous with the first planar area and is formed of a semipolar plane inclined to the first planar area, and a third planar area that is continuous with the second planar area and is formed of a C-plane parallel to the first planar area, a ridge stripe is provided in a partial portion of the second cladding layer above the second planar area, and In composition of partial portions of the active layer on both sides of the ridge stripe is higher than In composition of a partial portion of the active layer corresponding to the ridge stripe and/or thickness of the partial portions of the active layer on both the sides of the ridge stripe is larger than thickness of the partial portion of the active layer corresponding to the ridge stripe.

* * * * *

UNITED STATES PATENT AND TRADEMARK OFFICE
CERTIFICATE OF CORRECTION

| | | |
|---|---|---|
| PATENT NO. | : 7,899,102 B2 | |
| APPLICATION NO. | : 12/487195 | |
| DATED | : March 1, 2011 | |
| INVENTOR(S) | : Toshiyuki Obata | |

It is certified that error appears in the above-identified patent and that said Letters Patent is hereby corrected as shown below:

On the Title page of the patent:

Item (75) Inventors: "Toshiaki Obata, Miyagi (JP)"

should be

Item (75) Inventors: --Toshiyuki Obata, Miyagi (JP)--

Signed and Sealed this
Fifth Day of July, 2011

David J. Kappos
*Director of the United States Patent and Trademark Office*